US 6,603,882 B2

(12) United States Patent
Oh et al.

(10) Patent No.: US 6,603,882 B2
(45) Date of Patent: Aug. 5, 2003

(54) AUTOMATIC TEMPLATE GENERATION AND SEARCHING METHOD

(76) Inventors: Seho Oh, 5229 107th St. SW., Mukilteo, WA (US) 98275; Shih-Jong J. Lee, 15418 SE. 53rd Pl., Bellevue, WA (US) 98006

( * ) Notice: Subject to any disclaimer, the term of this patent is extended or adjusted under 35 U.S.C. 154(b) by 52 days.

(21) Appl. No.: 09/834,817

(22) Filed: Apr. 12, 2001

(65) Prior Publication Data

US 2003/0086616 A1 May 8, 2003

(51) Int. Cl.⁷ .................................................. G06K 9/68
(52) U.S. Cl. ...................................... 382/217; 382/240
(58) Field of Search ................................ 382/209, 217, 382/218, 299, 240

(56) References Cited

U.S. PATENT DOCUMENTS

| 5,063,603 A | * | 11/1991 | Burt ........................... 382/115 |
| 5,848,189 A | * | 12/1998 | Pearson et al. ............. 382/141 |
| 6,272,247 B1 | * | 8/2001 | Manickam et al. ......... 382/217 |
| 6,301,387 B1 | * | 10/2001 | Sun et al. .................... 382/181 |

FOREIGN PATENT DOCUMENTS

| JP | 09330403 A | * | 12/1997 | |
| JP | 10021389 A | * | 1/1998 | ............. G06T/7/00 |

OTHER PUBLICATIONS

Burt et al. "The Laplacian Pyramid as a Compact Image Code." IEEE Trans. on Communications, vol. COM–31, No. 4, Apr. 1983, pp. 532–540.*

Prasad et al. "High Performance Algorithms for Object Recognition Problem by Multiresolution Template Matching." Proc. of the Second Int. Conf. on Tools with Artifical Intelligence, Nov. 1995, pp. 362–365.*

Khawaja et al. "A Multiscale Assembly Inspection Algorithm." IEEE Robotics & Automation Magazine, pp. 15–22.*

Starovoitov et al. "Generalized Distance Based Marching of Nonbinary Images." Proc. of Int. Conf. on Image Processing, ICIP 98., vol. 1, Oct. 1998, pp. 803–807.*

Saad et al. "Multiresolution Approach to Automatic Detection of Spherical Particles from Electron Cryomicroscopy Images." Proc. of Int. Conf. on Image Processing. ICIP 98., vol. 3, Oct. 1998, pp. 846–850.*

* cited by examiner

Primary Examiner—Jon Chang

(57) ABSTRACT

A fast multi-resolution template search method uses a manually selected or an automatically selected template set, learned application specific variability, and optimized image pre-processing to provide robust, accurate and fast alignment without fiducial marking. Template search is directed from low resolution and large area into high resolution and smaller area with each level of the multi-resolution image representation having its own automatically selected template location and pre-processing method. Measures of discrimination power for template selection and image pre-processing selection increase signal to noise and consistency during template search. Signal enhancement means for directing discrimination of optimum template location are taught.

6 Claims, 13 Drawing Sheets

AUTOMATIC TEMPLATE GENERATION AND SEARCHING METHOD

U.S. PATENT REFERENCES

1. U.S. Pat. No. 5,315,700 entitled, "Method and Apparatus for Rapidly Processing Data Sequences", by Johnston et. al., May 24, 1994.
2. U.S. Pat. No. 6,130,967 entitled, "Method and Apparatus for a Reduced Instruction Set Architecture for Multidimensional Image Processing", by Shih-Jong J. Lee, et. al., Oct. 10, 2000.
3. Pending application Ser. No. 08/888,116 entitled, "Method and Apparatus for Semiconductor Wafer and LCD Inspection Using Multidimensional Image Decomposition and Synthesis", by Shih-Jong J. Lee, et. al., filed Jul. 3, 1997, now abandoned.
4. U.S. Pat. No. 6,122,397 entitled, "Method and Apparatus for Maskless Semiconductor and Liquid Crystal Display Inspection", by Shih-Jong J. Lee, et. al., Sep. 19, 2000.
5. U.S. Pat. No. 6,148,099 entitled, "Method and Apparatus for Incremental Concurrent Learning in Automatic Semiconductor Wafer and Liquid Crystal Display Defect Classification", by Shih-Jong J. Lee et. al., Nov. 14, 2000.
6. U.S. Pat. No. 6,141,464 entitled, "Robust Method for Finding Registration Marker Positions", by Handley; John C, issued Oct. 31, 2000.

CO-PENDING U.S PATENT APPLICATIONS

1. U.S. patent application Ser. No. 09/693723, "Image Processing System with Enhanced Processing and Memory Management", by Shih-Jong J. Lee et. al., filed Oct. 20, 2000, now U.S. Pat. No. 6,400,849.
2. U.S. patent application Ser. No. 09/693378, "Image Processing Apparatus Using a Cascade of Poly-Point Operations", by Shih-Jong J. Lee, filed Oct. 20, 2000.
3. U.S. patent application Ser. No. 09/692948, "High Speed Image Processing Apparatus Using a Cascade of Elongated Filters Programmed in a Computer", by Shih-Jong J. Lee et. al., filed Oct. 20, 2000, now U.S. Pat. No. 6,404,934.
4. U.S. patent application Ser. No. 09/703018, "Automatic Referencing for Computer Vision Applications", by Shih-Jong J. Lee et. al., filed Oct. 31, 2000.
5. U.S. patent application Ser. No. 09/702629, "Run-Length Based Image Processing Programmed in a Computer", by Shih-Jong J. Lee, filed Oct. 31, 2000.
6. U.S. patent application Ser. No. 09/738846 entitled, "Structure-guided Image Processing and Image Feature Enhancement" by Shih-Jong J. Lee, filed Dec. 15, 2000 now U.S. Pat. No. 6,463,175.
7. U.S. patent application Ser. No. 09/739084 entitled, "Structure Guided Image Measurement Method", by Shih-Jong J. Lee et. al., filed Dec. 14, 2000 now U.S. Pat. No. 6,456,741.
8. U.S. patent application Ser. No. 09/815816 entitled, "Automatic Detection of Alignment or Registration Marks", by Shih-Jong J. Lee et. al., filed Mar. 23, 2001.
9. U.S. patent application Ser. No. 09/815466 entitled, "Structure-guided Automatic Learning for Image Feature Enhancement", by Shih-J. Lee et. al., filed Mar. 23, 2001.

REFERENCES

1. Burt, P J, "Fast filter transforms for image processing," Comp. Graphics and Image Processing, 16: 20–51, 1981.
2. Burt, P J and Adelson, E, "The Laplacian pyramid as a compact image code," EEE Trans on Communication, COM-31: 532–540, 1983.
3. Lee, J S J, Haralick, R M and Shapiro, L G, "Morphologic Edge Detection," IEEE Trans. Robotics and Automation RA3(2):142–56, 1987.

TECHNICAL FIELD

This invention is related to image processing and pattern recognition and more particularly to automatically generating templates and searching for alignment in multi-resolution images using those templates.

BACKGROUND OF THE INVENTION

Many industrial applications such as electronic assembly and semiconductor manufacturing processes require automatic alignment. The alignment can be performed using pre-defined fiducial marks. This requires that marks be added to the subjects. This process limits the flexibility of the alignment options, increases system complexity, and may require complex standardization or, at a minimum, prior coordination. It is desirable to use a portion of the design structures of the subject as templates for the alignment purpose without adding specific fiducial marks. This removes the extra steps required to produce and insert the special fiducial marks.

The images of design structures of a subject such as circuit board or a region of a wafer can be acquired for alignment processing. However, the acquired images often exhibit low contrast and may be blurry or noisy in practical applications due to process characteristics and non-uniform illumination and noisy imaging system due to cost constraint. Therefore, both the template generation and the template searching processes could be challenging.

The automatically generated templates must be "stable" so that the search algorithm rarely misses the correct template location even if the contrast of the image varies. This is challenging since the images for template generation could include any customer designed patterns. Furthermore, image variations such as image contrast variations, image noise, defocusing, image rotation error and significant image shift greatly reduce the stability of image features.

Search for and estimation of template location technology can be applied to object tracking or alignment. A tracking system often requires location estimate of moving objects of interest. In an alignment application, the template search result is often used to dynamically adjust the position and orientation of the subjects. In both cases, a fast search and estimation method is required. This is challenging, especially for a large image.

PRIOR ART

A good template should have unique structures to assure that it will not be confused with other structures. It also needs to have stable and easily detectable features to ease the template searching process. In the current practice, a human operator selects the template region using his judgment and experience and a template matching process (usually normalized correlation) is used to search for the selected template. Unfortunately, it is difficult for a human operator to judge the goodness of design structure for template search in the template generation process. Therefore, template search accuracy and repeatability could be compromised in a low contrast and noisy situation. This demands an automatic method and process for the generation of a template from the design structures of a subject.

Prior art uses simple template matching. This method needs intense calculation and as a result the searching speed is slow. Another problem is that the template generation is a manual process requiring training and experience. This can lead to poor or variable performance when using the template for alignment because of the poor template generation. Furthermore, the template pattern is simply a sub-region of the image. There is no image enhancement or multi-scale feature extraction. This significantly limits the robustness and speed of the prior art approach.

OBJECTS AND ADVANTAGES

It is an object of this invention to automatically select a template or system of templates for alignment use. Using this template, no (or less) special fiducial marking is required.

It is an object of the invention to teach methods for signal enhancement for template generation.

It is an object of the invention to teach discrimination methods for template generation.

It is an object of the invention to teach learning methods for compensating for image variation and noise associated with a particular template search application and thereby reduces the deleterious effects of such variability.

It is an object of this invention to use a multi-resolution image representation of a subject to speed alignment processing and to increase robustness.

It is an object of this invention to teach use of coarse to fine processing using multi-resolution images to direct the template search and to increase its speed.

It is an object of this invention to develop image pre-processing that improves template search robustness and accuracy.

It is an object of this invention to provide separate image pre-processing and separate template generation for each resolution level of the multi-resolution image.

It is an object of this invention to allow the software implementation of the fast search method in a general computer platform without any special hardware to reduce cost and system complexity.

SUMMARY OF THE INVENTION

Alignment of industrial processes is commonly done using fiducial marks, marks that are added for the alignment or registration purpose. It is also possible to use portions of the images (i.e. a template) of the processed materials themselves to provide the reference needed for alignment. Selection of the template region is important to the robustness and accuracy of the resulting alignment process. In the invention, methods for automatic selection of the template region are taught. In addition, the invention improves overall signal to noise for template search (1) by use of structure specific image pre-processing, (2) a consistent template selection method based (in one embodiment) on an exhaustive search of all possible locations and pre-processing alternatives, (3) use of learning to reduce application specific variability, (4) use of multi-resolution image representation to speed template searching and template generation, (5) use of a coarse resolution to fine resolution search process, and (6) specific resolution level selection of template location, and (7) a discriminate function to guide automatic generation of templates and image pre-processing method. Matching methods for robustly locating the template within selected search possibilities are also taught.

BRIEF DESCRIPTION OF THE DRAWINGS

The preferred embodiments and other aspects of the invention will become apparent from the following detailed description of the invention when read in conjunction with the accompanying drawings which are provided for the purpose of describing embodiments of the invention and not for limiting same, in which:

FIG. 8a shows arrangements for morphological filtering vertically by a 3 element directional elongated filter;

FIG. 8b shows the arrangement for morphological filtering horizontally by a 3 element directional elongated filter;

FIG. 8c shows the arrangement for morphological filtering at a 45 degree angle below the horizontal by a 3 element directional elongated filter;

FIG. 8d shows the arrangement for morphological filtering at a 135 degree angle below horizontal by a 3 element directional elongated filter;

DETAILED DESCRIPTION OF THE INVENTION

Figure 1:
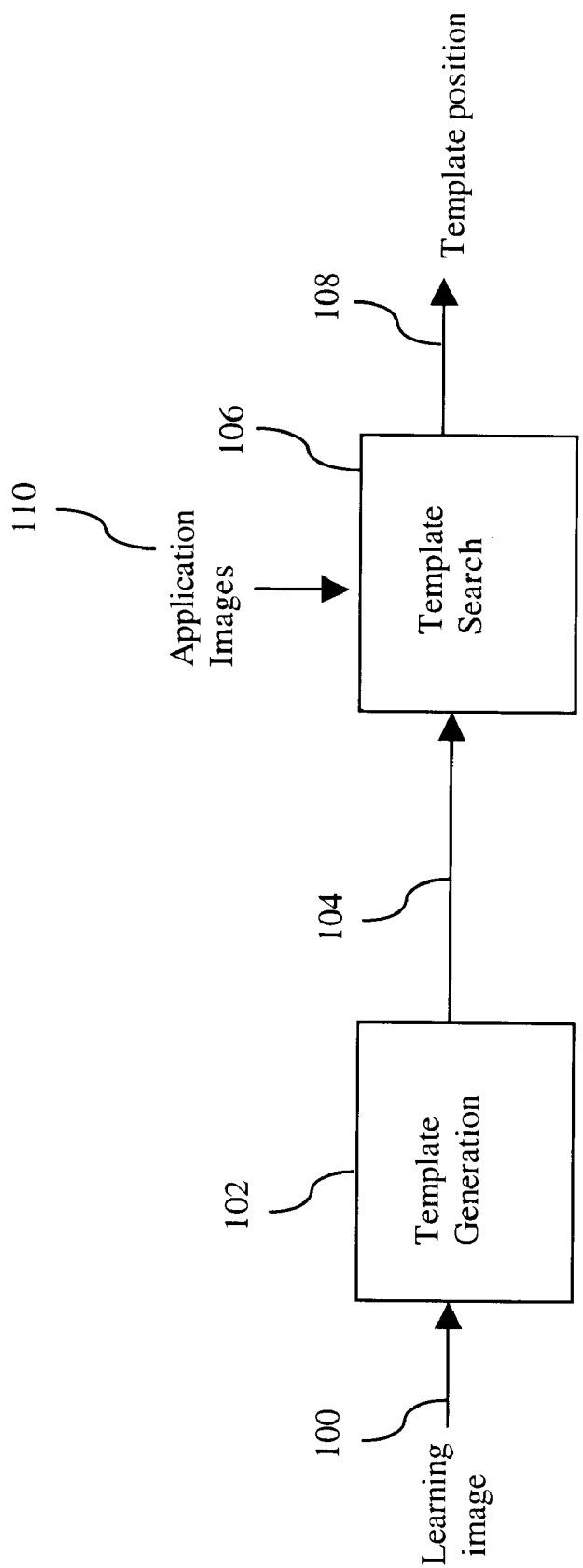
FIG. 1 shows the processing flow of a template search application scenario of this invention.

Many industrial applications require automatic alignment. Example processes include electronic assembly of printed circuit boards or semiconductor wafer manufacturing. The alignment can be performed based upon pre-defined fiducial marks. This requires the application designer to introduce marks into the subject manufacturing process. This uses space that might otherwise be better used, limits the flexibility of the alignment options, and increases system complexity. It is desirable to use a portion of the design structure of the subject as a template for alignment purpose instead of fiducial marks (or supplementary to them). This may decrease the extra steps required to produce and insert fiducial marks.

Design structures on a circuit board or a region of a wafer can be used for alignment processing. However, the images of those design structures often exhibit low contrast, non-uniform illumination, poor or non-uniform focus, noise, and other imaging faults or process related limitations. In this case, both the template generation and the template search process could be challenging.

A good template should have unique structures to assure that it will not be confused with other structures. It also needs to have stable and easily detectable features to ease the template searching process. In current practice, a human operator selects the template region and a template matching process is used to search for the selected template. Unfortunately, it is difficult for a human operator to judge the goodness of the selected design structure for template search. Therefore, template generation compromises template search accuracy and repeatability. An automatic method for the generation of the template from the design structures such as described herein does not have this limitation.

The automatically generated templates must be "stable" so that the search algorithm rarely misses the correct template location even if the contrast of the image varies. This is challenging because the images for template generation include any customer-designed patterns. Furthermore, image inconsistency caused by image contrast variation, image noise, defocusing, image rotation error or significant image shift greatly reduces image feature stability.

Another application of the technology described herein for search and estimation of template location is object tracking or alignment. A tracking system often requires location estimate of moving objects of interest. In an alignment application, the template search result is often used to dynamically adjust the position and orientation of the subjects. In both cases, a fast search and estimation method is required. The method may need to operate for large size images and need to operate in a short period of time.

This invention provides a fast template search method using a multi-resolution approach. It generates a multi-resolution image representation from the input image. The multi-resolution representation enhances image features at different scales and efficiently stores them in appropriate image resolution (Burt, P J, "Fast filter transforms for image processing," Comp. Graphics and Image Processing, 16: 20–51, 1981 and Burt, P J and Adelson, E, "The Laplacian pyramid as a compact image code," IEEE Trans on Communication, COM-31: 532–540, 1983). This allows the selection of stable features for the appropriate scale. Pre-processing sequence for image feature enhancement is defined as part of the template and templates are separately selected for each of the different image resolutions. Therefore, templates could be significantly different (pattern and image pre-processing method) at different resolutions to achieve the maximum effectiveness for fast and accurate template search.

The speed is achieved by using a coarse resolution to guide fine resolution search. Automatic multi-resolution template search uses lower resolution results to guide higher resolution search. Wide search ranges are applied only with the lower resolution images. Fine-tuning search is done using higher resolution images. This efficiently achieves wide range search and fine search resolution. To reduce cost and system complexity, a further objective of this invention is to design the software for the fast search method suitably for a general computer platform.

I. Application Scenario

FIG. 1 shows the processing flow for a template search application of this invention. At least one learning image 100 is used for template generation 102. The generated templates 104 are used for template search 106 on application images 110. The result of the template search 106 is the position of the template output 108. The template generation process can be performed manually or automatically.

Figure 2:
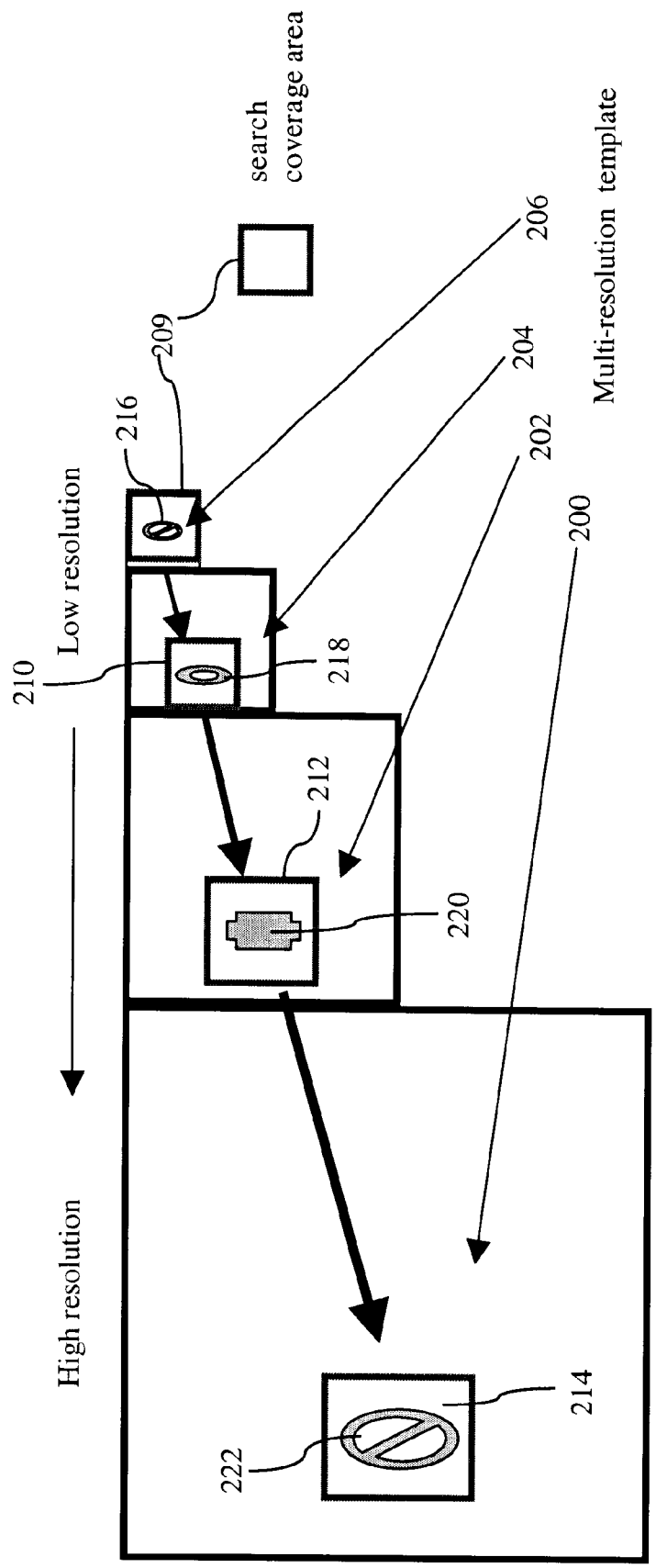
FIG. 2 shows an example of the multi-resolution templates and multi-resolution fast template position search method.

FIG. 2 shows an example that illustrates the multi-resolution templates and multi-resolution fast template position search methods of this invention. FIG. 2 shows a 4 level multi-resolution image representation with the lowest resolution representation 206 having a search area 209 equal in size to the total image area. The next higher resolution image representation 204 has an image search area 210 that is effectively smaller than the low-resolution search area 209. A template 218 is different than the template 216 used in the low-resolution search. The next higher resolution image 202 has a search area 212 that is effectively smaller than search area 210 and a uniquely selected template 220. The highest resolution image 200 that is the same as the resolution of the input image has a search area 214 that is smaller than search area 212. A template 216, 218, 220, 222 is defined for each image resolution. The template search starts from the lowest resolution image and progressively advances to higher resolution images. In this example, the search coverage area is fixed for all resolutions. However, due to the image size and resolution difference, the effective search areas are much wider for the lower resolution images as compared to that of the higher resolution images. However, the position accuracies of the higher resolution images are higher than the position accuracy of the lower resolution images. In this way, the lower resolution images perform coarse searches and direct the higher resolution images to the areas of interest to achieve high search result accuracy. Those skilled in the art should recognize that the search coverage areas can be different for different levels of the multi-resolution image representation.

II. Automatic Template Generation Method

Figure 3:
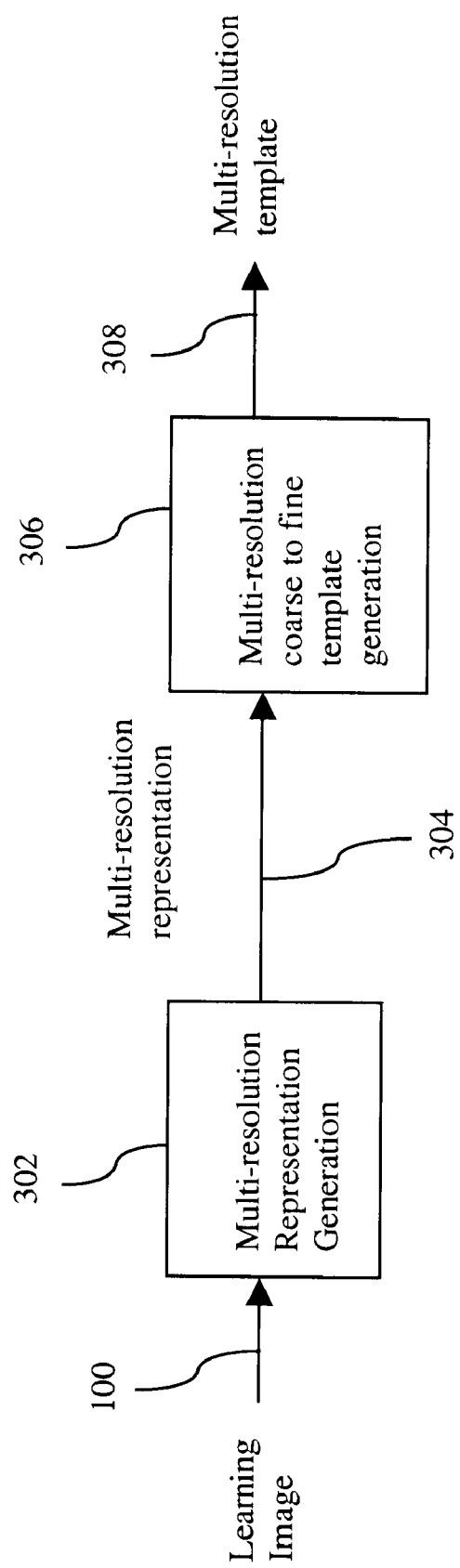
FIG. 3 shows the processing flow of the automatic template generation method.

The processing flow for the automatic template generation method of this invention is shown in FIG. 3. The learning image 100 is converted into multi-resolution representation 304 by a converter 302 and the multi-resolution templates output 308 is generated 306 from the multi-resolution representation 304.

II.1 Multi-Resolution Representation

Figure 4:
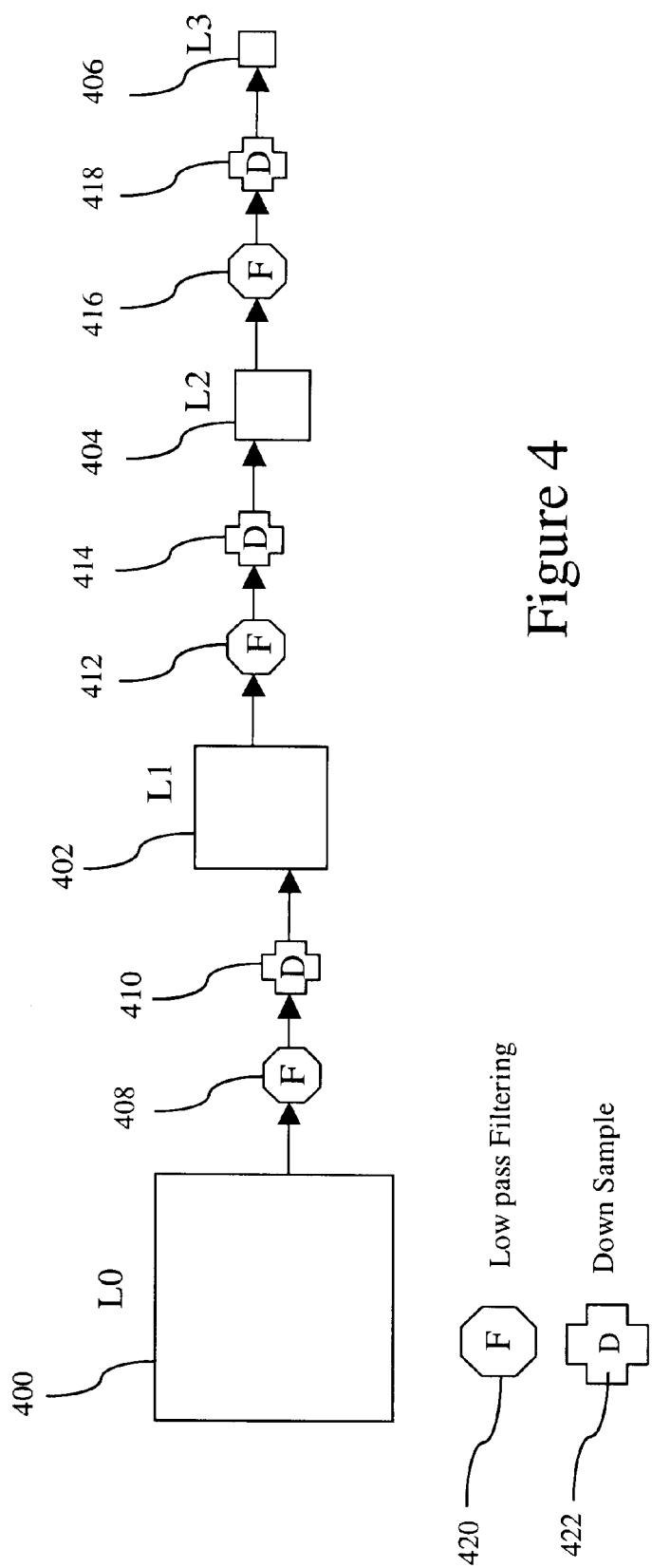
FIG. 4 shows the processing flow of a multi-resolution image generation process.

The multi-resolution representation enhances image features at different scales and efficiently stores them in appropriate image resolution. The processing flow is shown in FIG. 4. In this representation the size of the box for each image 400, 402, 404, 406 decreases, indicating the down sampling that has occurred and the corresponding reduction in the amount of data representing the image. The smaller amount of image data in the highest level (L3 in FIG. 4) 406 of the image pyramid stores low spatial frequency (low resolution) feature contents. The image in level L0, 400, is the input image. The level L1 image 402 is the result of a low pass filtering 408 and down sampling 410 operations. The level L2 image is derived by the same procedure applied to the level L1 image. This process continues until the lowest resolution, level L3, 406, is reached. In one embodiment of the invention, the low pass filtering operation (depicted symbolically as 420 and implemented as 408, 412, 416) is achieved by a Gausian filter. Those skilled in the art should recognize that other methods of filtering such as uniform filter, binomial filter, or other well-known linear filters could be used. Other possible filtering methods include nonlinear filters such as morphological dilation, erosion, opening, closing, or combination of opening and closing, and median filtering.

Those skilled in the art should recognize that other means for down sampling (depicted symbolically as 422 and implemented as 410, 414, 418) could be applied to generate the multi-resolution representation. Different down sampling methods generate different effects. The different effects can be combined to increase the robustness of a template search and template generation. Combinations can use statistical methods. In one embodiment of the invention, mean and deviation are used for the statistical methods. The combined results are used as the input for template search. Statistical methods can be applied to the results of the pre-processing of different multi-resolution representations derived from different down sampling methods. The different down sampling can be different spatial combinations of higher resolution elements to create the lower resolution element. For example, if one pixel of a lower resolution representation is derived from Q different pixels are $D_1, D_2, \ldots D_Q$ in the next higher resolution level then the "mean value" for a lower resolution element is:

$$MD = \frac{1}{Q} \sum_{i=1}^{Q} D_i$$

and the "deviation value" for a lower resolution element is:

$$SD = \sqrt{\frac{1}{Q} \sum_{q=1}^{Q} D_q^2 - MD^2}$$

Figure 5:
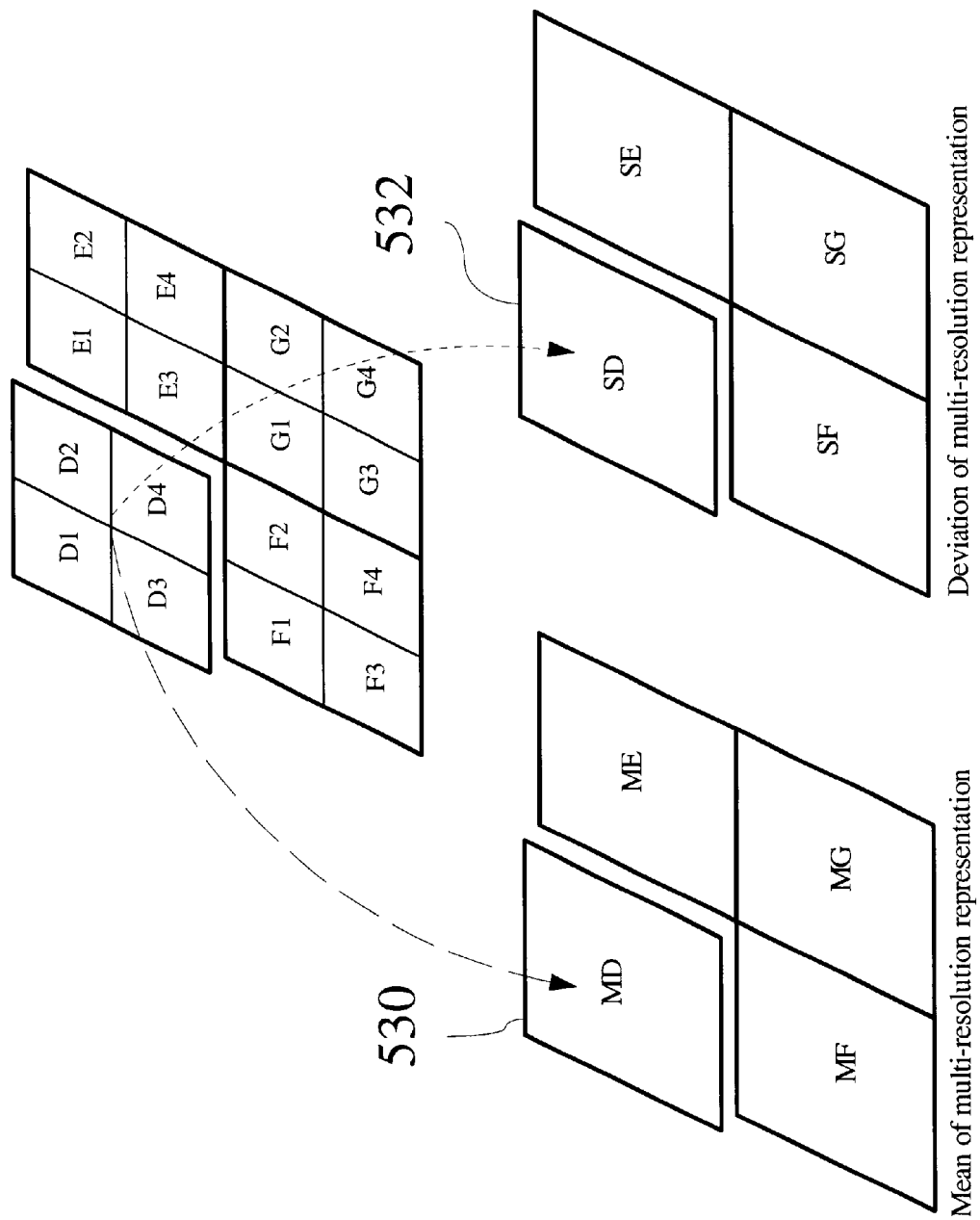
FIG. 5 shows the derivation of mean and deviation images for one type of downsampling of the multi-resolution representation.

FIG. 5 shows an example special case of a 2 to 1 down sampling case (2 by 2 becomes 1 by 1). In FIG. 5, Q is 4 and the multi-resolution representation of associated elements in each layer that determined the down sampled value is alphabetically depicted e.g. $D_1, D_2, D_3,$ and $D_4$ determine a down sample mean value MD and deviation value SD. In the FIG. 5 example, two distinct down sampled images are derived: (1) the Mean image 530 and (2) the Deviation image 532. These derived images are from a single image and the statistical measures are single image measures. Later, it is described how these statistical measures can be accumulated over a number of learning images. When this occurs, the statistics change. But, the new statistics have similar naming to those acquired from a single image. See Section II.2.4.

Figure 6:
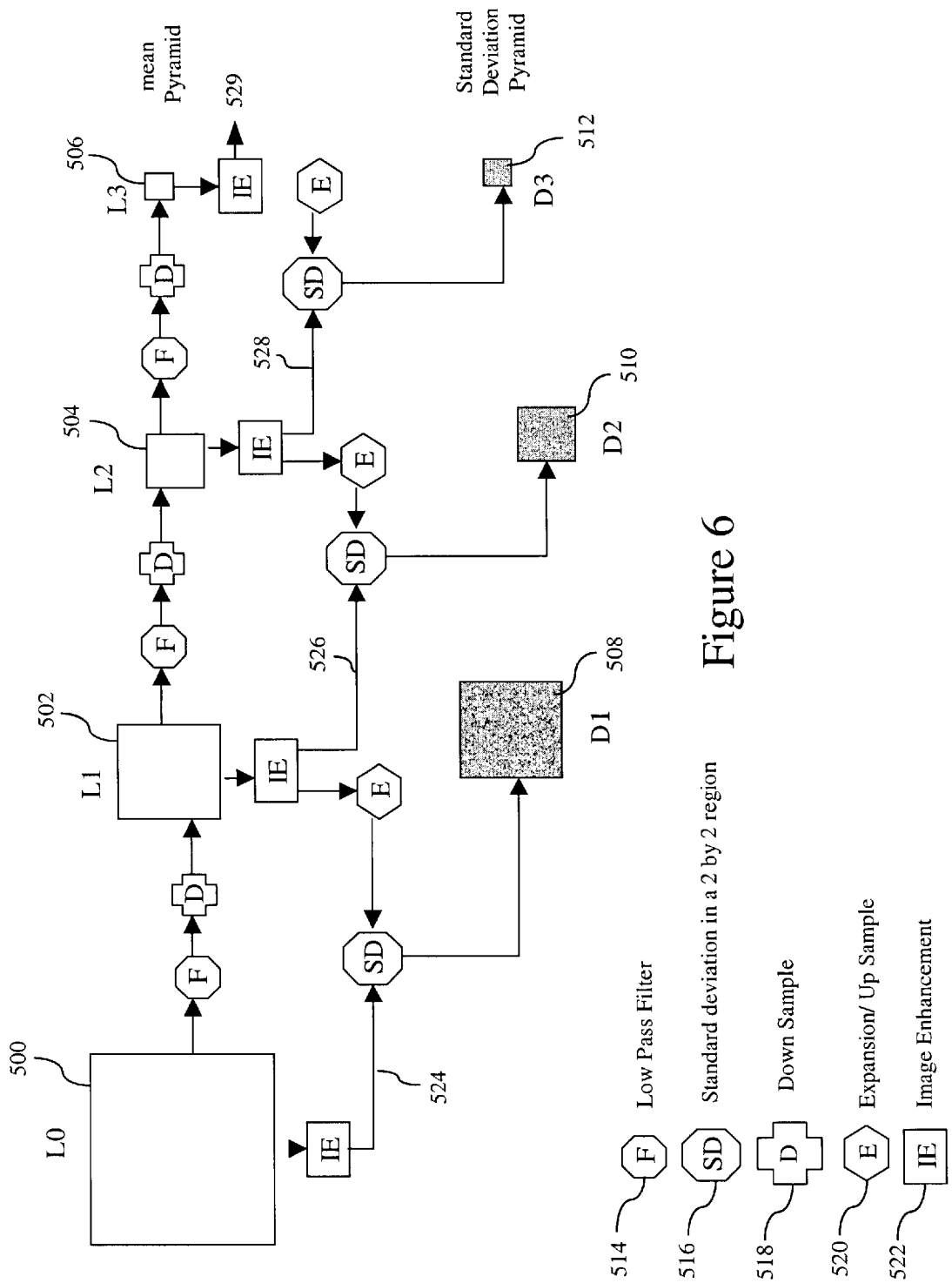
FIG. 6 shows a multi-resolution image representation with a mean and an image pre-processed deviation pyramid.

In another embodiment of the invention, the multi-resolution image representation includes a mean pyramid (500, 502, 504, 506) and an image enhanced deviation pyramid (508, 510, 512) as shown in FIG. 6. The multi-resolution representation of the image in FIG. 6 is generated from the original image 500 by a low pass filter such as flat filter, Gausian filter, and binomial filter, 514 and a down sample 518 operation successively applied to complete the down sample pyramid. Each level of the mean pyramid image representation is image enhanced (i.e. pre-processed) 522, and expanded 520 by simple element value replication to compute the deviation element value. In the embodiment the down sampling between layers 500, 502, 504, 506 is every other pixel in both the vertical and horizontal directions. The deviation pyramid values are derived by:

$$SD = \sqrt{\frac{1}{4} \sum_{q=1}^{4} (A_q - a_q)^2}$$

where $A_q$ is the value of the enhanced high resolution level $L_{i-1}$ of the pyramid and
$a_q$ is the value of the enhanced and expanded pixel from the lower resolution level $L_i$ of the pyramid.
Note that there are 4 distinct values for $A_q$ from $L_{i-1}$, for each associated pixel in $L_i$. The values for $a_q$ (q=1,2,3,4) are derived by expansion from $L_i$. The deviation pyramid values are single value for 4 values in $A_q$, thus the size of the deviation image $D_q$ is the same as the size of the down sample pyramid level $L_i$.

II.2 Multi-resolution Automatic Template Generation

Figure 7:
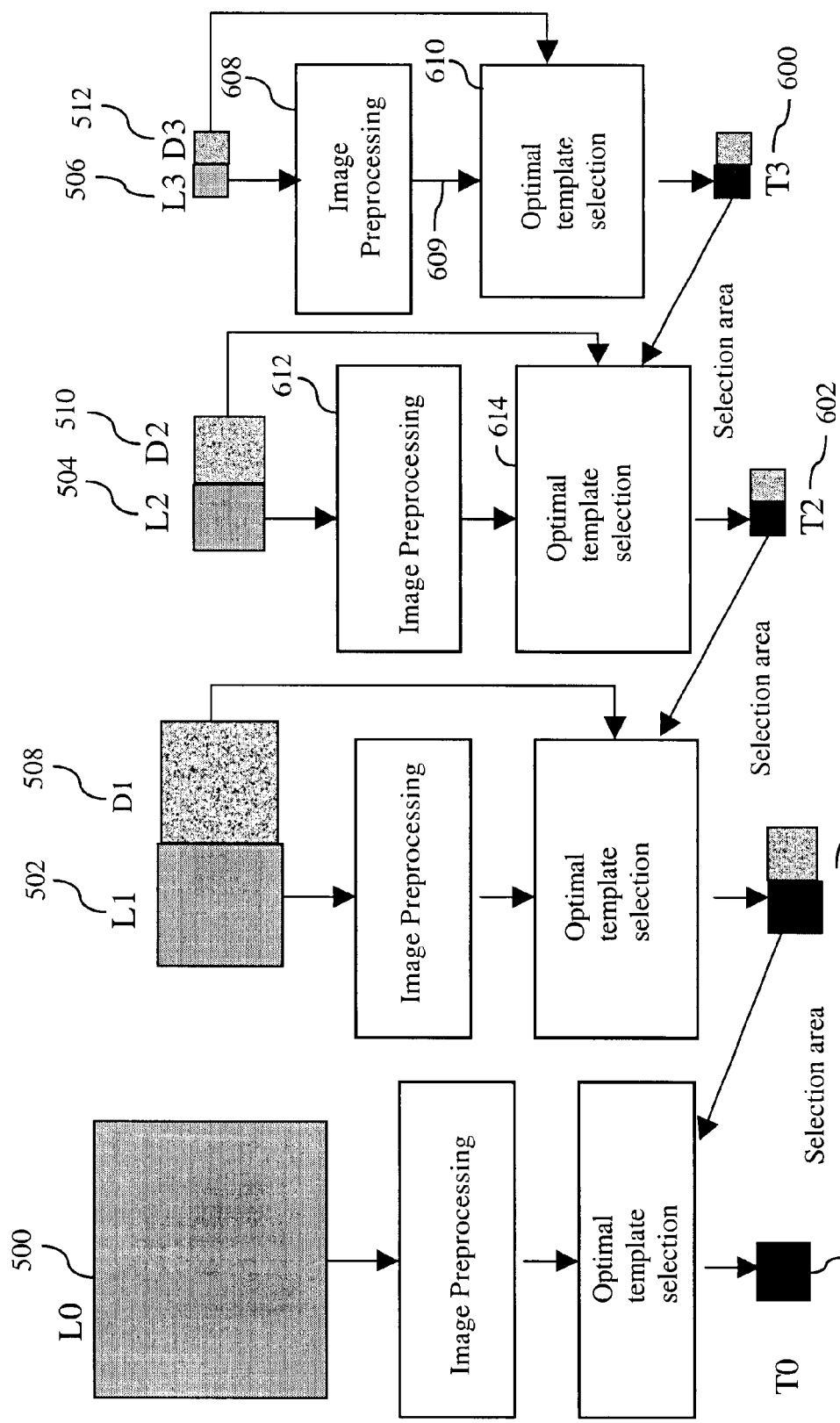
FIG. 7 shows the processing flow of the multi-resolution coarse to fine template generation process.

The multi-resolution templates are generated from lower resolution to higher resolution. Continuing the example begun in FIG. 6 but referring to FIG. 7, in one embodiment of the invention, the template $T_i$ is selected from the lowest resolution level of the pyramid 600 using the down sample image $L_i$ 506 and deviation representation of the image $D_i$ 512. The down sampled image $L_i$ 506 is first processed by different image pre-processing methods 608 and an optimal template generation method 610 selects the sub-image region and its associated image pre-processing method that yields the maximum discrimination power within the selection area among all proposed image pre-processing methods. The size range of the template can be predefined or determined by learning. Once an optimal template is selected at a low resolution 600, it defines a selection area for the next higher resolution image 504, 510 that is centered at the expanded version of the low-resolution template within a predefined tolerance region. The image pre-processing method 612 and template generation method 614 is applied again at the next higher resolution. This process is repeated until the template for the highest resolution image 606 is selected.

II.2.1 Image Pre-processing

Figure 8:
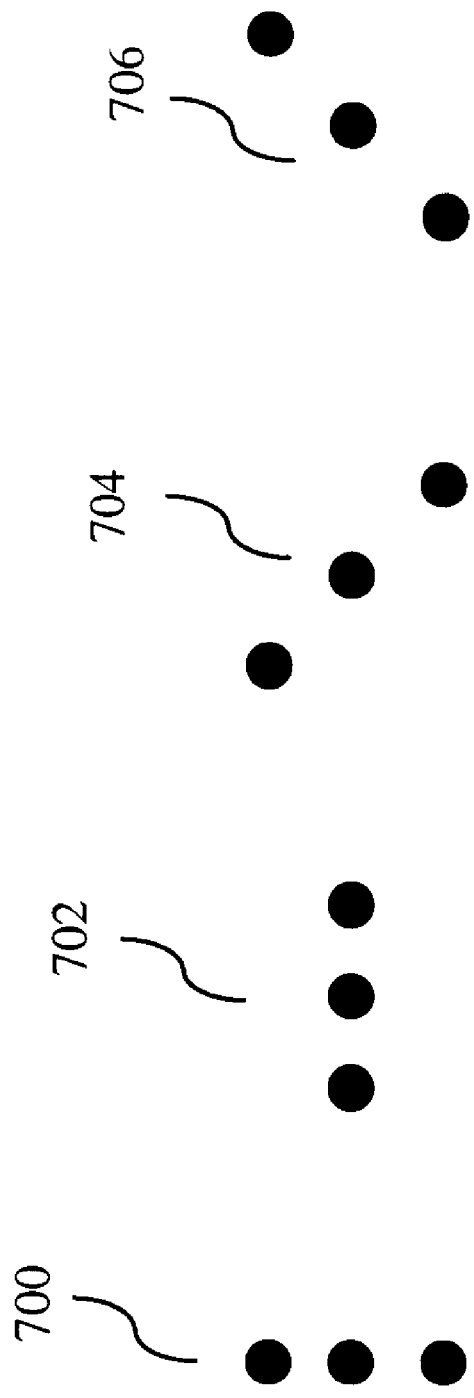
FIG. 8 shows arrangements for morphological filtering.

Image pre-processing operations are applied to each level of the multi-resolution image representation. The image pre-processing operations enhance the structure, contrast, and signal to noise appropriately at each level to increase the accuracy of the eventual template search. The image pre-processing operations can be different at different image resolutions. In the example, 608 may be different than 612 and so forth. The appropriate image pre-processing operation can be recorded as part of the template information. The image pre-processing operation enhances the template discrimination signal to noise ratio. In one embodiment of the invention, morphology filtering is used to perform the image pre-processing (reference U.S. patent application Ser. No. 09/738846 entitled, "Structure-guided Image Processing and Image Feature Enhancement" by Shih-Jong J. Lee, filed Dec. 15, 2000 which is incorporated in its entirety herein). Grayscale morphological filters can enhance specific features of the image. Typical morphological filters include opening residue that enhances bright lines, closing residue that enhances dark lines, erosion residue that enhances bright edges and dilation residue that enhances dark edges. Morphological processing is non-linear and therefore does not introduce phase shift and/or blurry effect that often accompany linear filters. Continuing the example, image structure can be highlighted using directional elongated morphological filters of different directions. Cascades of directional elongated filters are disclosed in U.S. patent application Ser. No. 09/692948, "High Speed Image Processing Apparatus Using a Cascade of Elongated Filters Programmed in a Computer", by Shih-Jong J. Lee et. al., filed Oct. 20, 2000 which is incorporated in its entirety herein. In one embodiment of the invention, three point directional elongated filters of four directions 700, 702, 704, 706 are used. The four filters are shown pictorially in FIG. 8 wherein each black dot represents a filter element corresponding to the elements of the pyramid being pre-processed.

Continuing the example, four different directional elongated filters can be combined by a maximum operation as follows:

Max (dilation residue by three point directional elongated filters)

Max (erosion residue by three point directional elongated filters)

Max (closing residue by three point directional elongated filters)

Max (opening residue by three point directional elongated filters)

In one embodiment of the invention, the above four image pre-processing operations and a no pre-processing option are evaluated separately in the automatic template generation process. The optimal template generation process selects one out of the five possible image pre-processing options as described in section II.2.2.

Those skilled in the art should recognize that other directional elongated filters or morphological filters of other shapes such as circular or rectangular can be used as alternatives for image pre-processing. Furthermore, shift invariant filters can be used as alternatives for image pre-processing. Specifically, a linear filter and a bandpass filter can be used to enhance specific features. Convolution with a special kernel can achieve the effect of de-blurring, or removing positional vibration, distortion, etc. The designer selects the image pre-processing alternatives and the discrimination process in section II.2.2 is used to select between the image pre-processing alternatives.

II.2.2 Optimal Template Selection for Each Resolution Level

In one embodiment of the invention, automatic template generation is performed in each resolution separately. The selection area of the template can be predefined or determined by learning as described in section II.2.4. The best template region can be determined as the sub-image that yields the maximum discrimination power within the selection area among all presented image pre-processing methods. In one embodiment of the invention, the discrimination power, Disc, for a given template is defined as:

$$Disc = \sqrt{S}\left(1 - \frac{M_2}{M_1}\right)$$

where S is signal content of the template and $M_1$ is the maximum matching value and $M_2$ is the second maximum matching value within the searching region. See section III.3 for explanation of the matching value determination. The selection area is defined by the tolerance of the search region.

Figure 9:
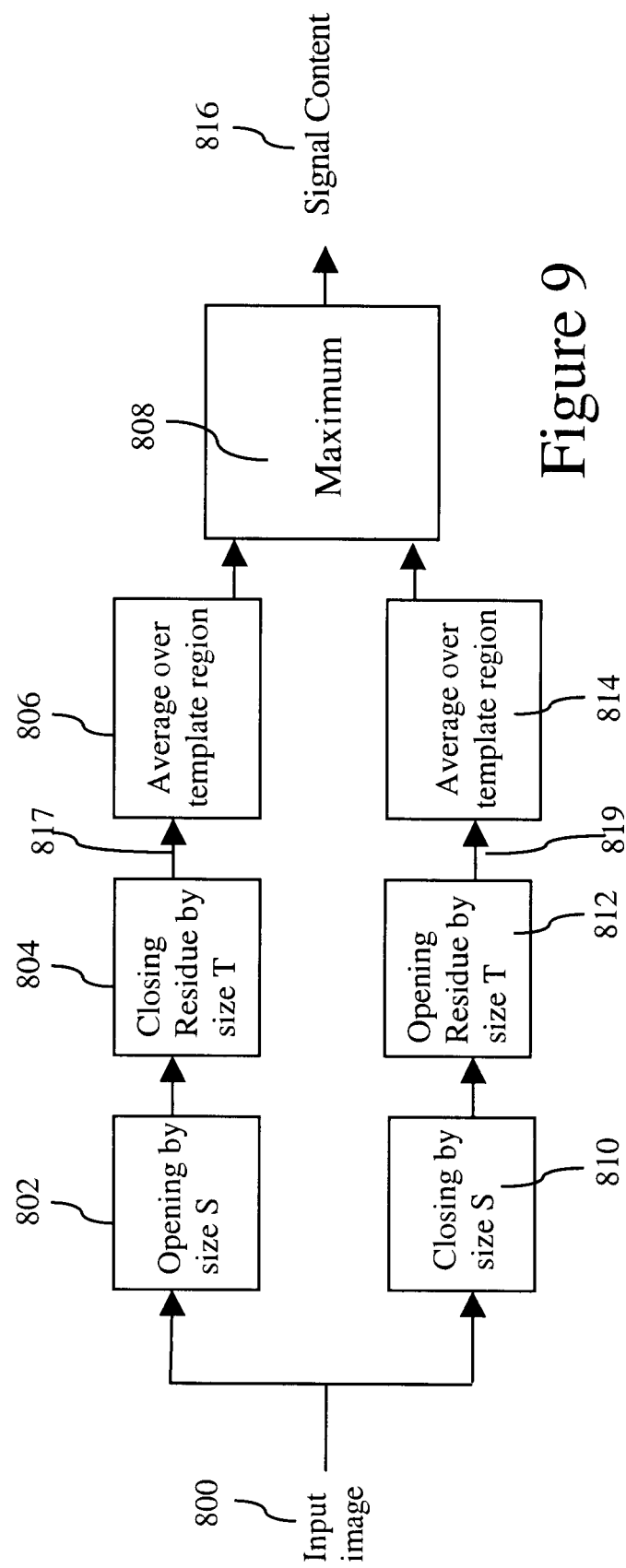
FIG. 9 shows the processing flow of one signal content calculation.

In one embodiment of the invention, the signal enhancement process is shown in FIG. 9. The signal enhancement process is distinct from image pre-processing. It is chosen by the designer to aid the template generation process but is not used when the selected template is later used. Signal enhancement is useful to reduce the effects of image noise on template generation. The nature of the noise influences the designer's choice for signal enhancement. In this disclosure, three example signal enhancement methods are taught. The signal enhancement method in FIG. 9 emphasizes lines in the image as the best measure of signal content. The upper portion of FIG. 9 802, 804, 806 processes dark lines of the image and the lower portion of FIG. 9 810, 812, 814 processes bright lines of the image. The output is signal content. Continuing the example begun in FIG. 6 and continued in FIG. 7, the pre-processed image (e.g. 609) is input for signal enhancement 800 by opening with an element S 802 followed by a closing residue using an element T and the resulting image is averaged 806 over the template region. The average over the template region can be calculated as:

$$S = \frac{\sum_{all\ x,y} I_s[x][y]}{\sum_{all\ x,y} 1}$$

where $I_s[x][y]$ is the signal enhanced image 817, 819 (or 917, 919, or 1010) at the resolution level of the multi-resolution representation. In a parallel operation the input preprocessed image 800 is closed by the element S then an opening residue is done with an element T 812 followed by an average of all the elements in the image in the template region. The maximum between the two results is selected 808 as the measure of signal content 816. In the embodiment the shape of the kernel is chosen according to the interfering structures apparent to the designer in the pyramid image. The shape of the kernels for the operation could be selected from different shapes such as directional elongated filters, circular, rectangular, etc. The size S is determined by the search possibility for multiple matches caused by fine pitch image detail. For example, without filtering local periodic structures, a nearly equally match can occur for multiple small differences in alignment between the template and the image. In the signal enhancement process described in FIG. 9, the operation with S removes confusion caused by regions of fine image detail greater than S elements wide and the size T is determined by the maximum line width that will determine alignment. In the continuing example embodiment of the invention, S is selected for the removal of local periodic structures and is shaped for the same purpose and T is also selected for the emphasis of alignment structures and is shaped for the same purpose.

Figure 10:
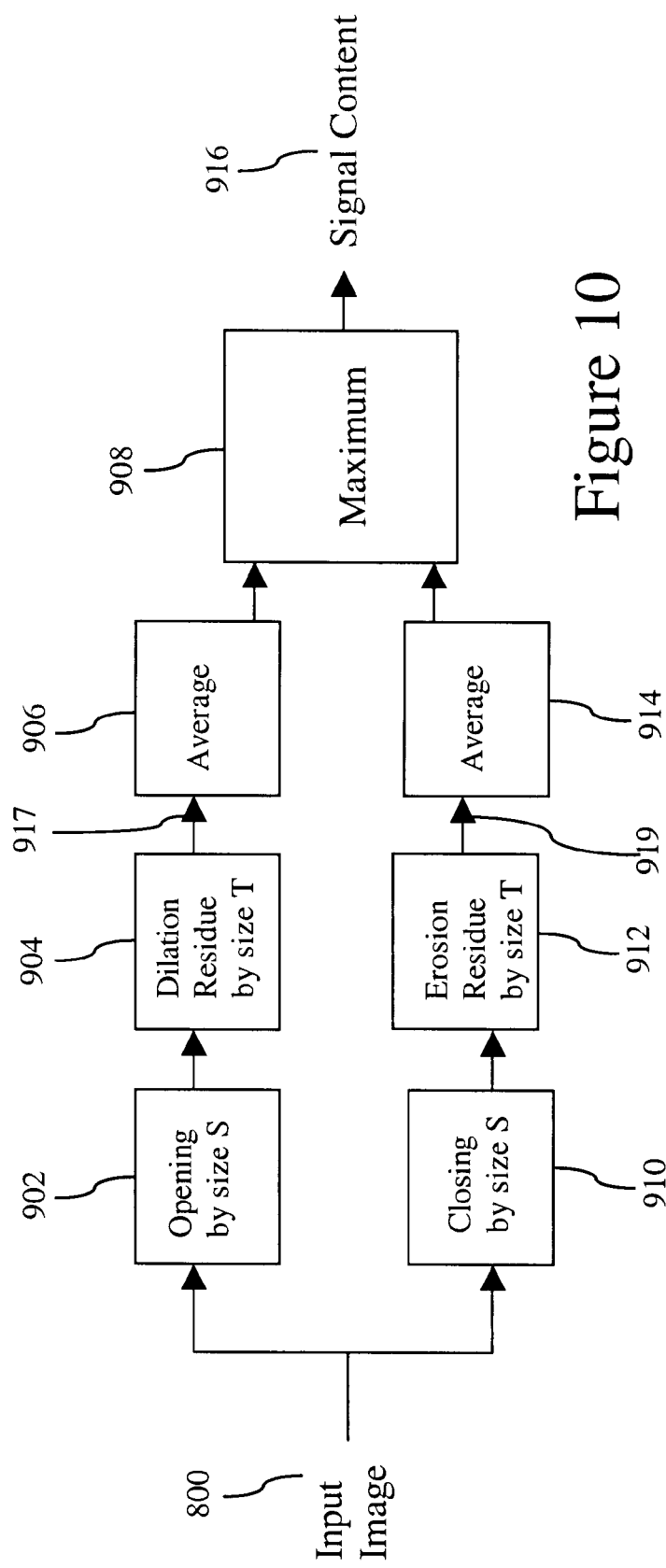
FIG. 10 shows the processing flow of another signal content calculation.

The signal enhancement method in FIG. 10 emphasizes edges in the image as the best measure of signal content. The upper portion of FIG. 10 902, 904, 906 processes dark edges of the image and the lower portion of FIG. 10 910, 912, 914 processes bright edges of the image. The output is signal content. In FIG. 10 an input image 800 is received. The image is opened by an element S 902 and a dilation residue is computed using an element T 904 followed by an average of all the elements of the image within the template region 906. In a mirrored process, the input image 800 is closed by an element of size S 910 and an erosion residue of size T is computed 912 followed by an average of all the elements of the image within the template region 914. A maximum of the results of the average is selected as the measure of signal content 916.

Figure 11:
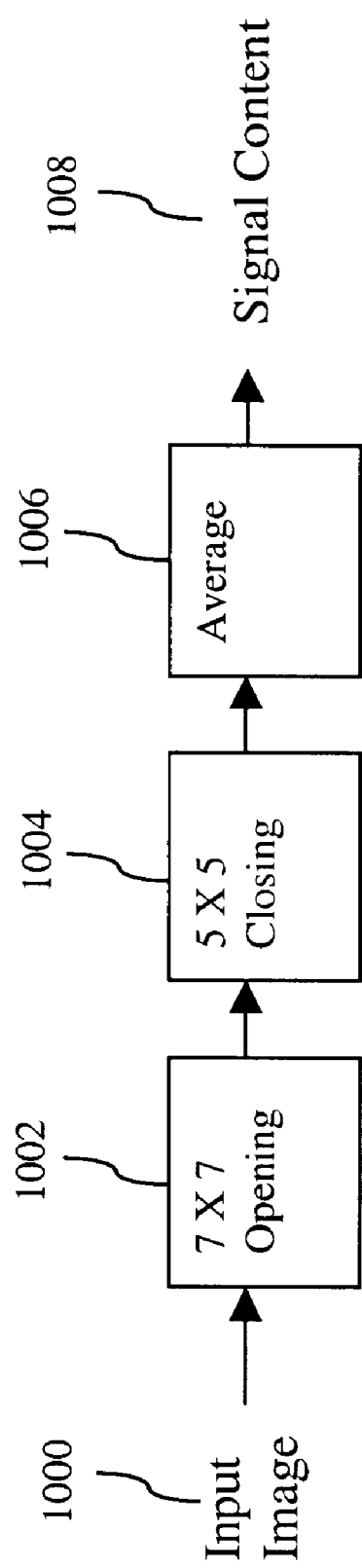
FIG. 11 shows the processing flow of a simple signal content calculation.

In another embodiment the image has dark lines that can be used for alignment. Alignment is to be determined based upon lines that are less than 5 elements wide and there are regions of fine image detail greater than 7 pixels wide that could confuse a match. For this condition, the signal enhancement shown in FIG. 11 is effective. The input image 1000 is opened by a 7 by 7 element 1002 and then closed using a 5 by 5 element 1004 followed by averaging of all the elements 1006 within the template region 1006 to produce a signal content measure 1008.

II.2.3 Template Representation

In one embodiment of the invention, each automatically generated template image representation level $T_i$ contains the following information:

1. Template mean and deviation images,
2. Size of template,
3. Type of image pre-processing (can be different for each resolution level), 4. Template offset amount relative to the template in the lower resolution, (Xr, Yr).

Figure 12:
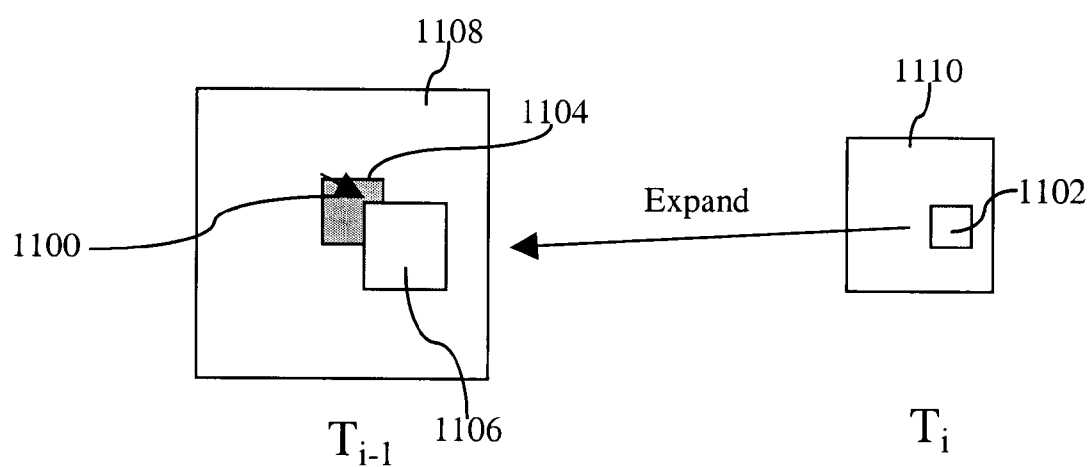
FIG. 12 shows the template offset for template image representation level i.

The template region from a lower resolution level $T_i$ represents a smaller region in the original image when it occurs in level Ti−1. The template region is offset as necessary to optimize the signal content in the method described in Section II.2.2. The template offset from the center of the template on the lower resolution image representation level $L_i$ is a vector having magnitude and direction 1100 as shown in FIG. 12.

II.2.4 Learning of the Template Image

Noise or image variations can significantly degrade the performance of a template search. In one aspect of this invention, learning assisted compensation for the variations can reduce this undesired effect. The method generates a template image, a deviation image and other information from a plurality of learning images. Refer to U.S. patent application Ser. No. 09/703018, "Automatic Referencing for Computer Vision Applications", by Shih-Jong J. Lee et. al., filed Oct. 31, 2000 which is incorporated in its entirety herein. In one embodiment of the invention, the learning process applies the following rules to accumulate results from the learning images. The accumulation is done separately for each resolution level. The example below is for one resolution level. A mean image is derived from the following recurrent rule:

$$M(n)=(1-r)*M(n-1)+r*k(n)$$

where M(n) is nth iteration mean image;

k(n) is the pre-processed mean image (524, 526, 528, 529) of the nth learning image and r is a weighting factor.

For uniform average, the value r is set to 1/n, and for the exponential average, the value of r is set to a constant. The learning process desired by the user determines the value for r.

The square image is derived from the following recurrent rule:

$$WS(n)=(1-r)*WS(n-1)+r*\{k(n)*k(n)+v(n)\}$$

where WS(n) is nth iteration square image; v(n) is the variation image of the nth learning image.

$$v(n)=SD^2$$

SD is the deviation image for a resolution level of nth learning image (FIG. 6 508, 510, 512)

From the mean and square images, a deviation image can be derived by the following rule:

$$D(n)=\sqrt{WS(n)-M(n)*M(n)}$$

Where D(n) is $n^{th}$ iteration deviation image.

Once M(n) and D(n) are determined we can calculate the matching function as described in section III.3.

III Automatic Template Search

When the templates are determined, they are used to search input images that are represented in multi-resolution formats to determine alignment. The automatic multi-resolution template search uses lower resolution search results to guide higher resolution search. In one embodiment of the invention, a robust correlation method is used that incorporates image enhanced deviation templates in the correlation process.

III. 1 Coarse to Fine Template Search Process

Figure 13:
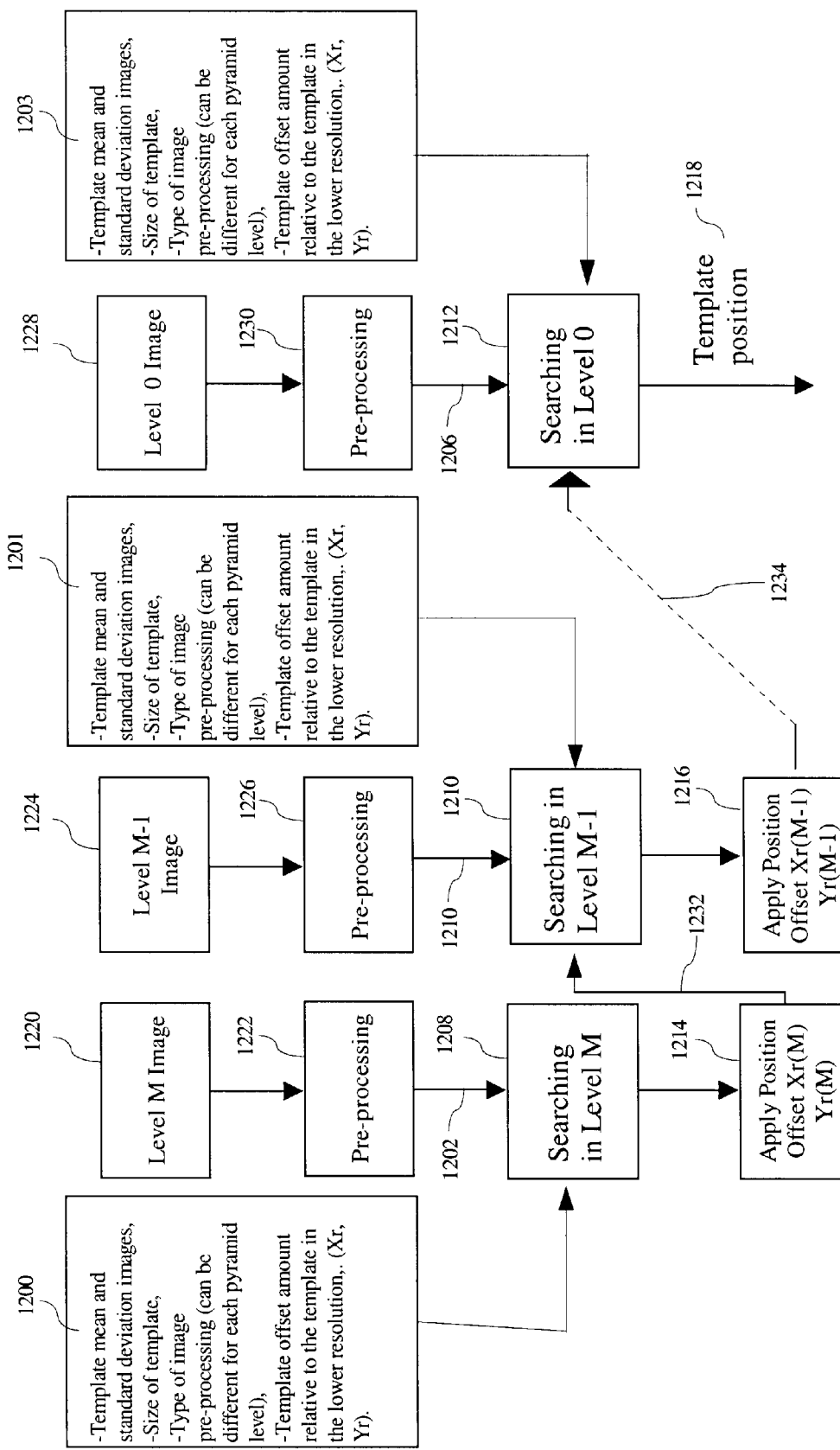
FIG. 13 shows the block diagram of the procedure of the searching method using multi-resolution representation.

In this invention, a multi-resolution approach is used to perform template search. FIG. 13 shows the processing flow of the template search method of this invention. A multi-resolution image has multiple levels of images with different resolutions. The 0-th level is at the original image resolution and the highest level image has the lowest image resolution. The search method is performed from the highest level (level M, having the lowest resolution) of the multi-resolution image to the lowest level (level 0, the original image) of the multi-resolution image. The search range at level M (coarse resolution) could include the entire image. The effective search range from level M-1 to level 0 image is gradually reduced to progressively focus the search. The required search ranges at different resolutions is determined by the chosen tolerance for the template position uncertainty.

FIG. 12 shows a diagram for template positioning at two levels of the multi-resolution image pyramid. In the lower resolution level the position of $T_i$ is shown 1102. A reference region 1110 becomes an area of the higher resolution level 1108. The template relative position in 1108 is 1104. An offset 1100 is applied to position the actual new template for $T_{i-1}$ at 1106. The position of the template of level i is defined by the relative position between templates in level i and level 1−1, and the position is described in level i−1 coordinates. The searching range is the relative range (in image elements) in level i−1 centered at the template image in level i. As shown in FIG. 13, the procedure of adjusting the position determines the center location of the searching range for level i−1 using the searching results of level I. In one embodiment of the invention, the relation between the search location output of level i and the center of the searching range in level 1−1 is determined by the following rule:

$$Xc(i-1)=\eta*X(i)+Xr(i)$$

$$Yc(i-1)=\eta*Y(i)+Yr(i)$$

Where (Xc(i−1), Yc(i−1)) is the center of the searching range for level i−1; (X(i), Y(i)) is the result of the search from level i, and (Xr(i), Yr(i)) is the position offset of the template between level i and level i−1. And η is the spatial sampling ratio between level i−1 and level i. Referring again to FIG. 13, the multi-resolution image pyramid presents different resolution images 1220, 1224, 1228 for searching. Each image is pre-processed 1222, 1226, 1230 with the pre-processing method that was determined in the template search process described in section II.2.2. The search process described in section II.2 is performed 1208, 1210, 1212 using template information for that particular level of resolution (a) Template mean and deviation images, (b) Size of template and (c) Template offset amount relative to the template in the lower resolution, (Xr, Yr) 1200, 1201, 1203. Offsets are produced from each search 1214, 1216, and applied to the next level search 1232, 1234. The output result is the template position in the original image 1218.

III.2. Template Search Method

The template search process finds the location within the search range of an image that maximizes a matching function for a given template. That is, $$\max_{xs,ys} \text{Matching}(xs, ys)$$

in the search range using the method described in section III.3 where Matching(xs,ys) is a matching function that is defined in section III.3.

Different methods can be used to perform the maximum search such as an exhaustive search method, a gradient search method, or a random search method. In one embodiment of the invention, the exhaustive search method is used that guarantees global maximum results.

III.3 Matching Function

In one embodiment of the invention, a cost function E that is the weighted square error between the template and gain and offset compensated image is defined as:

$$E = \sum_{template region} w[x][y](\alpha I[x-xs][y-ys] + \beta - I_t[x][y])^2$$

where $I[x][y]$ is the pre-processed input image from the multi-resolution image;

$I_t[x][y]$ is the template image;

$w[x][y]$ is the weighting image that is derived from the learning process;

$\alpha$ and $\beta$ are gain and offset compensation that are computed to minimize the cost function E.

The minimization of cost E is equivalent to the maximum of the following matching function:

$$\text{Matching }(xs, ys) = \frac{CV(I[x-xs][y-ys], I_t[x][y])}{CV(I[x-xs][y-ys], I[x-xs][y-ys])}$$

Where $$CV(I_1[x][y], I_2[x][y]) = \langle I_1[x][y] * I_2[x][y] \rangle - \langle I_1[x][y] \rangle \langle I_2[x][y] \rangle$$

and where $$\langle I[x][y] \rangle = \frac{\sum_{x,y} w[x][y] I[x][y]}{\sum_{x,y} w[x][y]}$$

(i.e. $\langle I[x][y] \rangle$ means compute the weighted average for the image as shown here)

In another embodiment of the invention, when the image offset is already accounted for as part of the pre-processing, a cost function E which is the weighted square error between the template and gain compensated image is defined as $$E = \sum_{template region} w[x][y](\alpha I[x-xs][y-ys] - I_t[x][y])^2$$

In this case, only the gain $\alpha$ is used to minimize cost function E because the offset is not useful.

The minimization of cost E is the same as the maximum of the following matching function:

$$\text{Matching }(xs, ys) = \frac{\langle I[x-xs][y-ys] I_t[x][y] \rangle}{\langle I[x-xs][y-ys] I[x-xs][y-ys] \rangle}$$

The weighted value $w[x][y]$ is set to 1.0 if there is no deviation image. When a learning process is applied, the weighted mean and deviation images of the template image region can be used for the matching function. In one embodiment of the representation, the $I_t[x][y]$ is the mean image in the template and the weight image is derived from the deviation image $$w[x][y] = \frac{1}{I_{td}[x][y]^2}$$

where $I_{td}[x][y]$ is the deviation image in the template.

In another embodiment of the invention, the mean and deviation image can be used as the input image. In this case, $I[x-xs][y-ys]$ is the mean image, and the weight image can be derived from the following rule:

$$w[x][y] = \frac{1}{(I_d[x][y] + I_{td}[x][y])^2}$$

where $I_d[x][y]$ is the deviation image of the input image after pre-processing.

The invention has been described herein in considerable detail in order to comply with the patent statutes and to provide those skilled in the art with the information needed to apply the novel principles and to construct and use such specialized components as are required. However, it is to be understood that the inventions can be carried out by specifically different equipment and devices, and that various modifications, both as to the equipment details and operating procedures, can be accomplished without departing from the scope of the invention itself.

What is claimed is:

1. An automatic template generation method comprising the steps of:
   a. input a learning image;
   b. generate a multi-resolution representation of the learning image;
   c. perform a multi-resolution template generation from low resolution to high resolution using the multi-resolution representation of the learning image to create a multi-resolution template output wherein said multi-resolution template generation for each resolution further comprises:
      i. input at least one learning image;
      ii. perform image pre-processing on the at least one input learning image;
      iii. perform an exhaustive search to select a template that yields the maximum discrimination power output wherein the discrimination power output for template generation is determined by:
         a) calculating the signal content from the input learning image, and
         b) calculating a first maximum matching value, and
         c) calculating a second maximum matching value.

2. The method of claim 1 wherein the discrimination power for template generation is related to the square root of the signal content.

3. An automatic template generation method comprising the steps of:
   a. input a learning image;
   b. generate a multi-resolution representation of the learning image;
   c. perform a multi-resolution template generation from low resolution to high resolution using the multi-resolution representation of the learning image having a multi-resolution template output wherein the multi-resolution template generation for each resolution further comprises:
      i. input at least one learning image;
      ii. perform image pre-processing on the at least one input learning image;

iii. perform an exhaustive search to select a template that yields the maximum discrimination power;
wherein the template consists of:
   a) template image;
   b) size of template;
   c) type of image pre-processing;
   d) template offset amount relative to the template in the lower resolution.

4. An automatic multi-resolution template search method comprising the steps of:
   a. input a multi-resolution template representation;
   b. input a multi-resolution image representation;
   c. perform a correlation method for a coarse-to-fine template search wherein the correlation method maximizes a matching function wherein said matching function includes a compensation method selected from the set consisting of image intensity gain variation, image intensity offset variation and image intensity gain and intensity offset variation;
   d. output the best match template position.

5. An automatic template searching method that does not require explicit definition of the template as input comprising the steps of:
   a. input a learning image;
   b. perform automatic template generation using a learning image that finds a separately selected sub-image within each level of a multi-resolution pyramid representation of the learning image that yields the maximum discrimination power wherein said template contains a template mean image and a template standard deviation image;
   c. input at least one application image;
   d. perform automatic template search using said template and the application image to generate a template position output.

6. The method of claim 5 wherein said template further selects the type of image pre-processing within each level of a multi-resolution pyramid to be performed during automatic template search.

* * * * *